(12) United States Patent
Burke et al.

(10) Patent No.: US 7,217,601 B1
(45) Date of Patent: May 15, 2007

(54) HIGH-YIELD SINGLE-LEVEL GATE CHARGE-COUPLED DEVICE DESIGN AND FABRICATION

(75) Inventors: Barry E. Burke, Lexington, MA (US); Vyshnavi Suntharalingam, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 45 days.

(21) Appl. No.: 10/691,080

(22) Filed: Oct. 22, 2003

Related U.S. Application Data

(60) Provisional application No. 60/420,652, filed on Oct. 23, 2002.

(51) Int. Cl.
*H01L 21/339* (2006.01)
*H01L 21/00* (2006.01)
*H01L 21/8238* (2006.01)

(52) U.S. Cl. .......................... 438/144; 438/48; 438/75; 438/216

(58) Field of Classification Search ........ 438/144–148, 438/48, 79, 75–76; 257/214–217
See application file for complete search history.

(56) References Cited

U.S. PATENT DOCUMENTS

| | | | |
|---|---|---|---|
| 3,728,590 A | 4/1973 | Kim et al. | |
| 3,853,634 A | 12/1974 | Amelio et al. | |
| 4,063,992 A | 12/1977 | Hosack | |
| 4,613,402 A | 9/1986 | Losee et al. | |
| 4,742,016 A * | 5/1988 | Rhodes | 438/146 |
| 5,114,833 A * | 5/1992 | Erhardt | 438/146 |
| 5,298,448 A | 3/1994 | Stevens et al. | |
| 5,302,544 A | 4/1994 | Lavine | |
| 5,314,836 A | 5/1994 | Lavine | |
| 5,556,801 A | 9/1996 | Hawkins et al. | |
| 5,606,187 A | 2/1997 | Bluzer et al. | |
| 5,719,075 A | 2/1998 | Hawkins et al. | |
| 5,760,431 A | 6/1998 | Savoye et al. | |
| 5,972,733 A * | 10/1999 | Hynecek | 438/79 |
| 6,130,449 A * | 10/2000 | Matsuoka et al. | 257/296 |

OTHER PUBLICATIONS

Browne et al., "A Nonoverlapping Gate Charge-Coupling Technology for Serial Memory and Signal Processing Applications," IEEE Jnl of Solid-State Circuits, vol. SC11, No. 1, pp. 203-207, Feb. 1976.

(Continued)

*Primary Examiner*—Chuong Anh Luu
(74) *Attorney, Agent, or Firm*—Theresa A. Lober

(57) ABSTRACT

In accordance with the invention, an electrically conducting charge transfer channel is formed in a semiconductor substrate and an electrically insulating layer is formed on a surface of the substrate; a layer of gate electrode material is formed on the insulating layer. On the gate material layer is formed a first patterned masking layer having apertures that expose regions of the underlying gate material layer that are to form gate electrodes, and the first-pattern-exposed regions of the gate material layer are electrically doped. In addition, on the gate material layer is formed a second patterned masking layer having apertures that expose regions of the underlying gate material layer that are to form gaps between gate electrodes, and the second-pattern-exposed regions of the gate material layer are etched.

20 Claims, 9 Drawing Sheets

OTHER PUBLICATIONS

Kapoor, "Charge-Coupled Devices with Submicron Gaps," IEEE Electron Device Ltrs., vol. EDL-2, No. 4, pp. 92-94, Apr. 1981.

Slotboom et al., "Submicron CCD memory structures fabricated by electron-beam lithography," Proc. IEDM '84, paper 11.6, pp. 308-311, 1984.

Gajar et al., "An ionic liquid-channel field-effect transistor," J. Electrochem. Soc., vol. 139, No. 10, pp. 2833-2840, Oct. 1992.

Yamada et al., "Driving Voltage Reduction in a Two-Phase CCD by Suppression of Potential Pockets in Inter-Electrode Gaps," IEEE Trans. on Electron Devices, V. 44, No. 10, pp. 1580-1587, Oct. 1997.

Okada et al., "Performance of FT-CCD image sensor with Single Layer Poly-Silicon Electrode," 1999 IEEE Workshop on Charge-Coupled Devices and Advanced Imager Sensors, pp. 219-222, Nagano, Japan, Jun. 1999.

Burke et al., "Charge-coupled device made with a single polysilicon level," Massachusetts Institute of Technology Lincoln Laboratory Solid State Research Quarterly Technical Report, pp. 31-37, Mar. 1, 2002.

* cited by examiner

HIGH-YIELD SINGLE-LEVEL GATE CHARGE-COUPLED DEVICE DESIGN AND FABRICATION

This application claims the benefit of U.S. Provisional Application No. 60/420,652, filed Oct. 23, 2002, the entirety of which is hereby incorporated by reference.

STATEMENT REGARDING FEDERALLY SPONSORED RESEARCH

This invention was made with Government support under Contract No. F19628-00-C-0002, awarded by the Department of Air Force. The Government has certain rights in the invention.

BACKGROUND OF INVENTION

This invention relates generally to charge-coupled devices (CCDs), and more particularly relates to the design and fabrication of CCD gate electrodes.

Conventionally, overlapping gate electrode configurations are employed for CCD designs, with timing control for CCD charge collection and transfer imposed on a charge transfer channel by the gate electrodes. In an overlapping gate electrode configuration, two or more layers of electrically conducting gate electrode material are deposited and patterned to define adjacent gate electrodes, the edges of which overlap along the length of the charge transfer channel. The effective gap width between such overlapping gate electrodes is on the order of the thickness of the dielectric layer that isolates the electrode overlap, which is on the scale of angstroms. This narrow effective gap width enables a high charge transfer efficiency from one gate electrode to the next by substantially inhibiting formation of electrical potential barriers in the charge transfer channel between adjacent gate electrodes.

Although this overlapping CCD gate electrode design does indeed enable a high charge transfer efficiency, it introduces significant complexity into a CCD microfabrication process. For example, the thermal processing required for each separate gate electrode layer subjects the various device regions to increased heat cycling, which the device design must take into account. Further, the lithographic and etching steps required for multiple gate electrode layers increases the probability of process errors and defects that reduce the overall yield of the device fabrication sequence. As imaging applications continue to demand larger arrays of CCD elements and smaller elements within an array, process errors, fabrication defects, and reduced fabrication yield become increasing limitations, and process cost and time become increasingly burdensome.

A single-level-gate CCD design has been shown to reduce the microfabrication complexity associated with multi-layer, overlapping gate electrode designs. In addition, a single-level-gate CCD design is known to reduce the thermal budget of a CCD microfabrication sequence and can reduce the number of required processing steps. In terms of device operation, the elimination of overlapping gate electrodes can reduce CCD gate capacitance and therefore can reduce the power required to drive gate electrode control voltages.

Successful implementation of a single-level-gate CCD design requires that the interelectrode gap, i.e., the gap between adjacent gate electrodes, be quite small, e.g., on the order of 0.3 µm or less. This small interelectrode gap is needed so that a high charge transfer efficiency can be maintained with only moderate gate electrode control voltages, and is a requirement for most current CCD imaging applications. But the implementation of a single-level gate design having a small interelectrode gap width can be extremely challenging; it is found that fabrication defects can be increased and process yield decreased by various process steps added in an effort to reduce gap width. This is particularly the case for CCD fabrication sequences directed to applications that additionally require a large-area CCD array and/or small CCD element dimensions.

SUMMARY OF THE INVENTION

The invention provides a single-level gate CCD design and a corresponding microfabrication process that can produce the design with a high yield and with a low number of process defects. In the microfabrication process, an electrically conducting charge transfer channel is formed in a semiconductor substrate and an electrically insulating layer is formed on a surface of the substrate; a layer of gate electrode material is formed on the insulating layer.

On the gate material layer is formed a first patterned masking layer having apertures that expose regions of the underlying gate material layer that are to form gate electrodes, and the first-pattern-exposed regions of the gate material layer are electrically doped. In addition, on the gate material layer is formed a second patterned masking layer having apertures that expose regions of the underlying gate material layer that are to form gaps between gate electrodes, and the second-pattern-exposed regions of the gate material layer are etched.

With this process, a single level of gate electrodes can be defined by two completely independent process steps that each employ a separate patterning, i.e., lithographic, process. With this two-lithography process, an electrically-bridging, short circuit path between two adjacent gate electrodes cannot result from a bridging short caused by one of the photolithographic steps alone, and instead can result only when a bridging short occurs at the same lithographic mask location of a given gate electrode for both lithographic steps. It is recognized in accordance with the invention that such an occurrence is extremely unlikely, and therefore that the yield of the two-step lithographic process of the invention for producing a single-level gate electrode structure is accordingly quite high.

The single-gate-level CCD fabrication process of the invention further can be carried out by forming an electrically conducting charge transfer channel in a semiconductor substrate, and forming on a substrate surface a first patterned masking layer having apertures that expose regions of the underlying substrate surface that are to form gate electrodes. The first-pattern-exposed regions of the substrate surface are then electrically doped. Further there is formed on the substrate surface a second patterned masking layer having apertures that expose regions of the underlying substrate surface layer that are to form gaps between gate electrodes, and the second-pattern-exposed regions of the substrate surface are etched.

These methods of the invention can be extended to enable fabrication of electrically conducting electrodes for a wide range of applications, by, e.g., forming an electrically insulating layer on a surface of a substrate, and forming a layer of electrode material on the insulating layer. On the electrode material layer is formed a first patterned masking layer having apertures that expose regions of the underlying electrode material layer that are to form electrodes, and the first patterned exposed regions of the electrode material layer are electrically doped. On the electrode material layer is also formed a second patterned masking layer having apertures that expose regions of the underlying electrode material layer that are to form gaps between electrodes, and the second patterned exposed regions of the electrode material layer.

Similarly, electrically conducting electrodes can be fabricated in accordance with the invention by forming on a substrate surface a first patterned masking layer having apertures that expose regions of the underlying substrate surface that are to form electrodes, and electrically doping the first-pattern-exposed regions of the substrate surface. Additionally, there is formed on the substrate surface a second patterned masking layer having apertures that expose regions of the underlying substrate surface layer that are to form gaps between electrodes, and the second-pattern-exposed regions of the substrate surface are etched.

The electrode design and fabrication process provided by the invention can be applied to any electronic or microelectromechanical structure for which there is to be defined electrically conducting electrodes having a gap between adjacent electrodes. The high yield characteristic of the process enables application of the resulting devices for large device arrays, such as wide-area imaging arrays, and enables production of such with an elegantly simple process sequence. Other features and advantages of the invention will be apparent from the following description and the accompanying figures, and from the claims.

DETAILED DESCRIPTION OF THE INVENTION

The invention provides a device design and corresponding microfabrication process sequence that enables very high yield production of devices or structures requiring a narrow gap between conducting electrodes. This device design and process sequence is particularly well-suited for the fabrication of Charge-Coupled Devices (CCDs) employing a single CCD gate level. The microfabrication process sequence of the invention provides the distinct advantage of producing single gate level CCD structures with a high fabrication yield. Such a high-yield, single-gate-level CCD process is particularly valuable both from the point of view of microfabrication process simplicity as well as CCD device performance, as discussed in detail below. The discussion below focuses on a single-gate-level CCD design and process, but it is to be understood that this is provided as an example only, and that the invention is not limited to such. Additional device and structure designs are contemplated by the invention, as described below.

Figure 1:
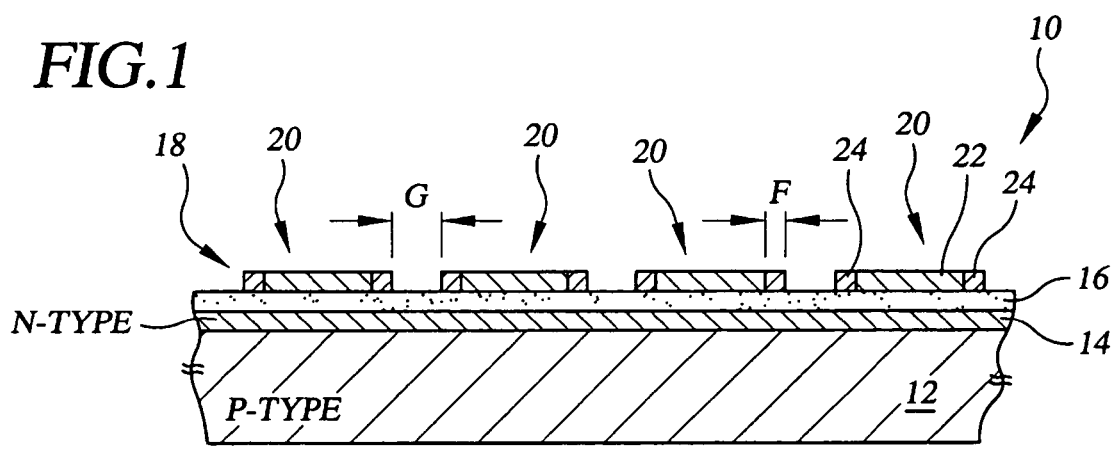
FIG. 1 is a schematic cross-sectional view of an example CCD device structure in accordance with the invention.

Turning then to a single-gate-level CCD design in accordance with the invention, adjacent CCD control gates are provided of a common gate material level, rather than of differing material layers as is conventional. FIG. 1 provides a schematic side-view illustration of the CCD configuration 10 provided by the invention. A semiconductor substrate 12, e.g., an electrically doped silicon substrate, here shown as a p-type substrate is provided, including a doped, buried CCD charge collection and transfer channel 14, shown as an n-type channel, or other selected charge transfer configuration. On the surface of the semiconductor substrate is provided a gate dielectric layer 16, e.g., a layer of silicon dioxide or other dielectric material.

A single level 18 of patterned and electrically-doped gate electrode material is provided atop the gate dielectric layer 16. As shown in the figure, each gate electrode 20 defined in the single gate level consists of a central electrically doped region 22, here indicated as an n+ doped region. This electrically conducting region enables independent control of the electrical potential in the charge transfer channel 14 of the semiconductor substrate below distinct gates. Each central region 22 is flanked by end regions 24, the extent, F, of which can be doped, undoped, or partially doped, in the manner described below. This doping profile can be provided in any suitable gate level material, e.g., amorphous silicon or polysilicon, or other suitable material, as discussed below. The doping profile results in a central gate region that is electrically conducting, with flanking end regions that are either likewise conducting or substantially nonconducting.

The lateral gap, G, between two such adjacent CCD gates, i.e., the interelectrode gap of the gate level, is preferably quite small, e.g., on the order of about 0.3 μm or less, in order to maintain good charge transfer efficiency (CTE) along the charge transfer channel at moderate gate control voltages. It is challenging to successfully produce such a small interelectrode gap with conventional microfabrication process sequences, and particularly so for production of a large area CCD array, without a resulting high percentage of electrically bridging short circuit paths between adjacent gate electrodes.

The invention provides a microfabrication process sequence that enables production of a single gate level configuration with a high yield, i.e., with very low occurrence of electrical bridging between adjacent gate level electrodes, even over a large CCD array. This is achieved in accordance with the invention by defining the single level of gate electrodes 18 by two completely independent steps that each employ a separate lithography process. With this two-lithography process, an electrically-bridging, short circuit path between two adjacent gate electrodes cannot result from a bridging short caused by one of the photolithographic steps alone, and instead can result only when a bridging short occurs at the same lithographic mask location of a given gate electrode for both lithographic steps. It is recognized in accordance with the invention that such an occurrence is extremely unlikely, and therefore that the yield of the two-step lithographic process of the invention is accordingly quite high.

Figure 2:
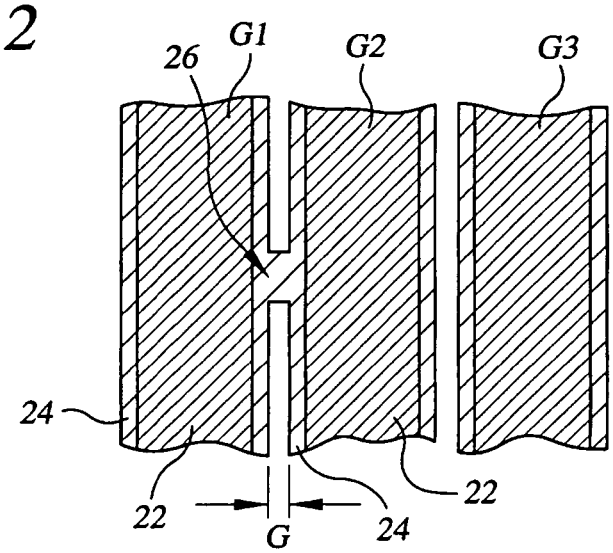
FIG. 2 is a planar view of three adjacent gate structures, illustrating a first example processing error between gates G1 and G2.

FIG. 2 is a schematic top-down plan view of three adjacent gate electrodes, G1, G2, G3, after this two-lithography etching and doping sequence. In this example, a mechanical bridging of material 26 is shown to exist between the first two gates, G1 and G2. This bridging of material could occur due to, for example, a localized failure in the etch of the gate electrode material, e.g., in a failure of a plasma etch of a polysilicon gate electrode material. But note that the bridging between the gates G1 and G2 is of high electrical resistance, undoped gate material like that which can exist at the flanking edge regions 24 of the gates, and therefore is substantially nonconducting. This nonconducting material bridge is therefore not a fatal low-resistance, electrically conducting short, and thus has substantially no impact on device performance.

Figure 3:
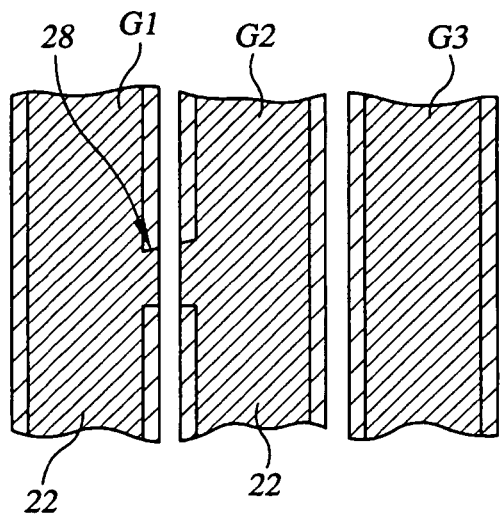
FIG. 3 is a planar view of three adjacent gate structures, illustrating a second example processing error between gates G1 and G2.

FIG. 3 is a schematic top-down plan view similar to that of FIG. 2, again showing three adjacent gate electrodes, G1, G2, and G3. Here is illustrated an example in which doping errors 28 due to, e.g., a lithographic defect, results in an extension of the doping of central gate regions 22 for gates G1 and G2 into the undoped edge flanking regions of those gates; the doping errors 28 are shown to be at generally the same location for clarity. Because the two adjacent gates are physically separated by the first etching step, this doping error does not result in a mechanical bridging of two electrical conducting regions. Accordingly, as in the first example, this error has substantially no impact on device performance.

Thus, in accordance with the invention, an electrically conducting bridging short between two adjacent single-level gate electrodes can occur only if a mechanical bridging of material between two adjacent gates occurs in the exact position of a doping extension beyond the central region of the same two adjacent gates. Such an occurrence is understood to be extremely low. As a result, the invention enables precise and reproducible, high-yield production of single level gate structures having very small interelectrode spacing.

The following process sequence is provided as an example of microfabrication techniques that can be employed to produce the single-gate level CCD structure of the invention. It is to be recognized, however, that such is not limiting, in that alternative materials, process parameters, and fabrication techniques can be employed.

In an example fabrication process for producing the single-level gate CCD structure of the invention, a silicon substrate is provided, upon which is grown or deposited a gate dielectric film or films. Such films can consist of, e.g., $SiO_2$ grown at high temperatures on the wafer in an ambient of $O_2$ or $H_2O$, and can include additional deposited layers, e.g., of $Si_3N_4$ or $SiO_2$, as desired for a given application. In one example process, a composite-material gate dielectric is produced as a 30 nm-thick thermal $SiO_2$ layer, a deposited 20 nm-thick $Si_3N_4$ layer, and a deposited 10 nm-thick $SiO_2$ layer. Conventional oxide growth and nitride and oxide deposition techniques can be employed as are well known in the art.

Figure 4A:
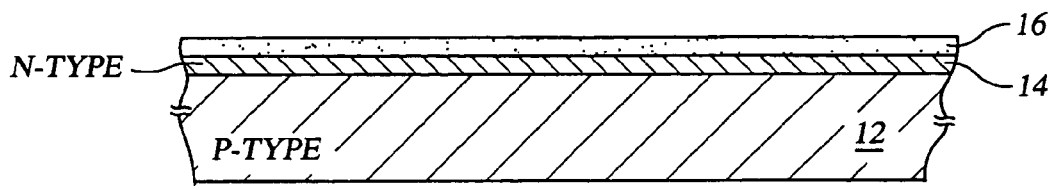
FIGS. 4A–4G are schematic cross-sectional views of a fabrication sequence provided by the invention for producing the example CCD device structure of FIG. 1.

In the conventional manner, a charge collection and transfer channel such as a buried channel can be incorporated into the CCD substrate, provided as, e.g., a layer of dopant of a type opposite to that of the substrate type. For example, given a p-type silicon substrate, the buried channel would be an n-type dopant. The preferred method of creating the buried channel is by ion implantation, either before or after the gate dielectric is formed. In one example, the buried channel can be produced by implanting phosphorus ions, e.g., at an energy of 125 keV and dose $1.25 \times 10^{12}$ cm$^{-2}$, through the gate dielectric. The resulting structure is shown in cross-section in FIG. 4A.

Figure 4B:
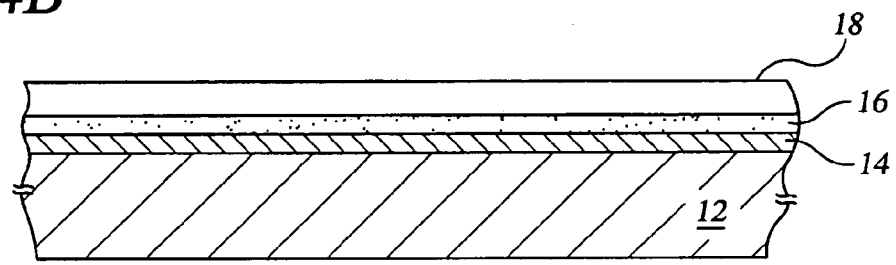

Once the gate dielectric layer formation and buried channel doping are complete, the production of single-level control gates can be carried out in accordance with the invention. Referring to FIG. 4B, in a first step for gate fabrication, a layer of gate material 18 is formed on the dielectric layer 16 by any suitable process. A wide range of materials can be employed for the gate layer in the conventional manner. For most CCD applications, a layer consisting of silicon, ranging in morphology from amorphous silicon to fine grain polysilicon, can be preferred. As is well-understood, as the morphology of the layer becomes more pronounced, e.g., as the polysilicon grains become larger and approach the interelectrode gap width, G, precise etching of the gap can become problematic; relatively finer grain polysilicon can therefore be preferred. Whatever gate material is employed, it can be deposited as an undoped layer, or can be doped, either during deposition or in a subsequent process. It is preferred in accordance with the invention that the gate material be provided undoped, as explained in detail below.

In one example process, an amorphous film of silicon is deposited at a temperature of about 570° C. to produce a gate level thickness of about 225 nm. The thickness is not critical, but a range of between about 150 nm and about 300 nm can be preferred for many applications. In one example deposition process, $SiH_4$ gas is employed at a pressure of, e.g., about 800 mTorr to produce the amorphous silicon film. It is to be recognized that the material deposition conditions effect the morphology of the layer, and thus such conditions are preferably selected, in the conventional manner, to not impede production of a selected interelectrode gap, G.

Figure 4C:
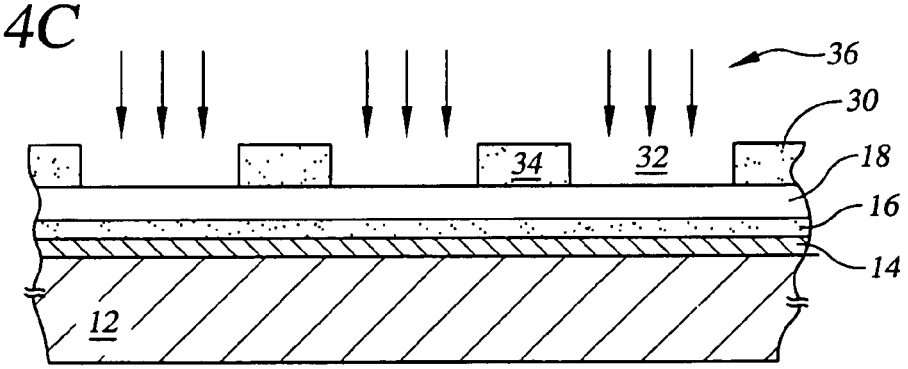

In a next step, the gate level material is selectively doped by employing a combination of suitable lithographic and doping processes. In one example process, as shown in FIG. 4C, the amorphous silicon layer 18 is coated with a layer of photoresist 30, and a photomask pattern representing the regions of the amorphous film that are to form the gate electrodes, to be doped, is transferred to the resist using lithographic techniques. Regions of the gate level material 18 that are to be left undoped are maintained coated with photoresist while regions that are to be doped to form the gate electrodes are exposed by apertures 32 in the developed photoresist layer, in the conventional manner.

In accordance with the invention, the pattern of the photoresist masking layer 30 preferably takes into account lateral dopant diffusion from the central region (22 in FIG. 1) of each gate. Specifically, the regions of photoresist 34 between photoresist apertures 32 preferably are of an extent that includes the desired interelectrode gap width, G, and an additional extent accounting for the undoped flanking regions, F, (24 in FIG. 1). Once the dopant is introduced into the gate level material, activation of the dopant results in its lateral diffusion; subsequent processing steps can further enhance such lateral dopant diffusion. As a result, to ensure production of a final interelectrode gap that is not smaller than the intended design gap, G, some initial undoped flanking region extent must be included in the patterned mask. Then, depending on the lateral dopant diffusion, a portion or all of the flanking region extent may become doped due to lateral dopant diffusion. The invention does not require that undoped flanking regions necessarily result from the process sequence, but a mask design that conservatively results in such regions can be preferred to ensure that the design gap, G, is maintained even after all lateral dopant diffusion. Finally, a mask bias can be employed in the conventional manner to provide consideration for possible lithography errors.

The photoresist material employed in this first patterning step can be provided as any suitable material, and can be patterned in any convenient manner, including photolithography, E-beam lithography, or other patterning process. Deep UV lithography can be preferred for many applications. The resist is preferably thick enough to fully block the gate level material doping for the correspondingly selected doping technique. In one example process, a layer of 690 nm Shipley UV5 photoresist is employed, with 248 nm lithography employed for patterning the photoresist layer. It is to be recognized that other masking materials can be employed, including hard masks of a selected material other than photoresist, and that composite masks of distinct multiple material layers also can be employed.

Referring again to FIG. 4C, with the patterned photoresist mask in place on the gate material layer, a dopant is introduced into the film, e.g., by ion implantation 36; for many applications, ion implantation can be preferred. Generally either n- or p-type dopants can be used. For example, for p-type doping, boron can be employed in the form of $BF_2$, implanted, e.g., at an energy of about 25 keV and a dose of about $5 \times 10^{15}$ $cm^{-2}$, while for n-type doping arsenic can be implanted at an energy of, e.g., about 30 keV and a dose of about $5 \times 10^{15}$ $cm^{-2}$.

As explained above, it is preferred in accordance with the invention that the gate material layer be provided as an undoped layer; such enables the gate electrode doping process just described. If however, the gate electrode material layer is provided doped with a background dopant, then the gate electrode doping process preferably accounts for such. For example, given a gate electrode material layer that is uniformly doped with an n-type dopant, the gate electrode doping then preferably is of a p-type dopant, such that a pn-junction exists at the edge of each doped region. With this configuration, should a mechanical bridge of gate electrode material (FIG. 2) erroneously occur between adjacent gate electrodes, such would consist of back-to-back pn-junctions. One of these junctions would always be reverse-biased, given any gate voltage, and therefore would not allow electrical conduction between adjacent gate electrodes. The invention therefore does not require that the gate electrode material only be doped by the masked doped process described above; the gate electrode material layer can be provided as an undoped or doped layer, so long as the masked gate electrode doping process takes the doping condition of the gate material into account.

The implantation energies, and thus the penetration depth of the implanted ions, are preferably chosen so that during subsequent dopant activation and/or other thermal processes, the dopant will diffuse sufficiently to dope the thickness of the gate level material more or less uniformly. However, the energy preferably is not so high as to allow ions to penetrate through the gate level material and gate dielectric layer to be implanted into the silicon substrate. The dose is not critical, but values that are too low will result in a film that is too resistive for the propagation of high-speed electrical signals and also make it difficult to form electrical contacts to the metallization that is produced later in the process. For example, ion implantation doses of between about $2 \times 10^{15}$ $cm^{-2}$ and about $1 \times 10^{16}$ $cm^{-2}$, or other selected dose, can be employed.

Figure 4D:
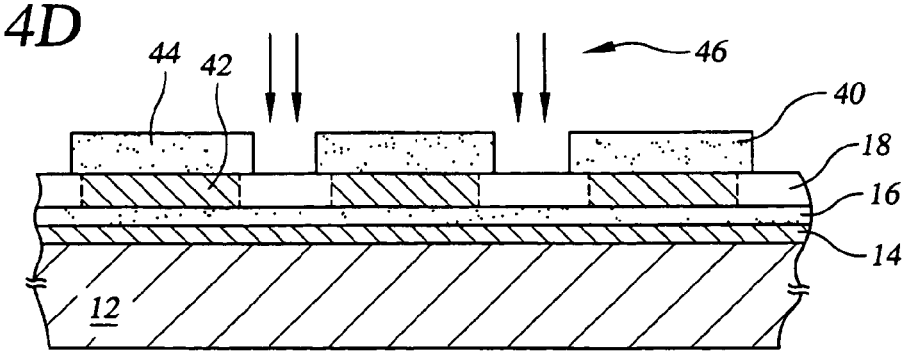

Referring to FIG. 4D, once the implantation or other doping technique is complete, the patterned photoresist layer 30 is removed, and in a next step, a new layer of photoresist 40 is deposited and patterned in the manner described above, e.g., with lithographic techniques, such that doped regions 42 of the gate material layer that are to form the gates are covered in resist while the remainder of the layer is exposed. The edges of the doped regions 42 of the gate material layer are indicated in the figure by dashed lines. Note that the photoresist regions 44 shielding the doped gate layer regions 42 preferably extend beyond the edges of the doped gate layer regions 42 to account for subsequent lateral dopant diffusion, in the manner discussed just previously. The particularly selected pattern of the two photoresist layers thereby in combination determines the interelectrode gap, G, and the extent of undoped flanking regions, F, if any, for each gate electrode.

The masking material employed here preferably accounts for the technique selected to etch the gate material layer. In one example, an antireflection coating, e.g., 140 nm Shipley AR3, is first applied, followed by a selected photoresist layer, such as 690 nm Shipley UV5 photoresist. 248 nm lithography is then employed to pattern the photoresist layer. As explained above, alternative masking materials and patterning processes can be employed, and composite masking materials can be employed as suitable.

With the patterned masking layer 40 in place, the gate material layer is then etched, preferably using a gaseous plasma etch 46, to mechanically define the CCD gates. In one example, a transformer-coupled plasma (TCP) system, e.g., a model 9400 manufactured by Lam Research Corporation, can be employed, with the etch gas consisting of, e.g., a mixture of $Cl_2$, HBr and He. Other etch systems and etch chemistries can be employed as would be well recognized. Whatever etch technique is employed, it preferably does not etch the dielectric layer 16 underlying the gate material layer. Thus, e.g., if a plasma overetch step is to be employed, such preferably accounts for the criticality of maintaining the dielectric layer properties. For example, given the etch gas mixture given above, an overetch gas mixture of HBr, He, and $O_2$ can be preferred. Once the gate level etch is complete, the patterned photoresist layer 40 is removed.

With this last step, the structure of FIG. 1 is produced, providing mechanically separated and electrically doped CCD control gates.

In accordance with the invention, the sequence of steps just described, i.e., gate material layer doping followed by gate material layer electrode etching, can be preferred, but if desired, the order of the steps can be reversed, i.e., the gate etching can be carried out prior to gate doping. In such a process, it is preferred, however, that the gaps between adjacent gates be masked such that the gate dopant does not penetrate the gate dielectric into the substrate channel. Such masking is preferably wider than the physical gap to accommodate alignment latitude and resist exposure and development variations. This results in the undoped end flanking regions of the gate electrodes as described above. Further, it can be preferred for this etch-first scenario that the gate electrode dopant implant energy be specifically selected with consideration for a possible mask error, and specifically, a masking error that could expose a gap between adjacent gates. Such a mask error could allow the subsequent doping implantation to penetrate the exposed gate insulator and inadvertently dope the CCD channel. To avoid this possibility, the energy of the doping implant is preferably selected to be sufficiently low that penetration of the gate insulator layer by the implant could not occur.

But for many applications, it can be more efficient and effective to employ a process sequence in which the gate material layer is first doped and then etched, in the manner described above. If there occurs a mask error, introduction of an unwanted particle, a photoresist defect, or other process error, doping of a previously etched gate material layer could also dope regions between the intended gate electrodes, possibly resulting in doping of the charge transfer channel. In accordance with the invention, the charge transfer channel is not doped by the gate material layer doping process.

Whatever gate formation sequence is employed, at this point in the process, the dopant introduced into the gate material layer can be activated, e.g., by an annealing step at a temperatures above about 900° C. In one example process, dopant activation is carried out by rapid thermal anneal (RTA), in which the wafers are brought rapidly up to a temperature of about 1000° C. and held there for about 20 seconds, followed by a rapid cool down to room temperature. Whatever dopant activation process is employed, it can be preferable to select activation conditions that also promote the conversion of amorphous silicon gate material into polycrystalline silicon, i.e., polysilicon. If such is not the case, then a separate crystallization step can also be employed.

Alternative to this example rapid thermal anneal activation, a conventional anneal in an inert gas atmosphere, or other activation process step, can be employed. For example, steam oxidation of the doped and patterned gate material layer at a temperature of about 900° C. can also be employed. Such a process can be particularly efficient in that it provides a dielectric layer overlying the gate material layer, which can be employed for various device structures as discussed below. Such an oxidation process also could oxidize away a mechanical bridge between adjacent gates like that shown in FIG. 2. It is to be recognized, of course, that an explicit dopant activation step need not be employed if subsequent processing is understood to provide adequate thermal conditions for diffusing the dopant to fully dope the thickness of the gate material layer.

The formation of silicide can also be integrated into the single-level gate CCD fabrication sequence to dramatically reduce the sheet resistance of the gate electrodes, while retaining the highly reliable polysilicon/silicon dioxide interface. Silicides can be formed by well-known standard techniques: either by direct deposition of a silicide; or by deposition of a metal film on top of silicon, followed by a reaction between the metal and silicon to form a silicide. In the second technique, metal deposited on non-silicon surfaces, such as silicon dioxide or silicon nitride, is preferably selectively removed from the device structure. Metals which can be employed in the silicide process include, e.g., cobalt, titanium, nickel, molybdenum, tungsten, and tantalum. $CoSi_2$, $TiSi_2$, and NiSi have an advantage of very low thin-film resistivity, while $WSi_2$ has an advantage of high thermal stability. Other suitable metal films can also be employed in accordance with the invention.

Figure 4E:
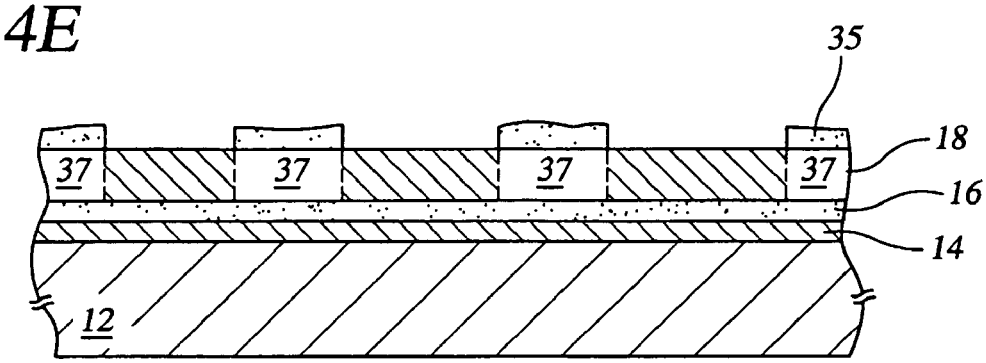

A silicide process in accordance with the invention can be carried out after the gate material layer is doped, as in FIG. 4C, and the patterned dopant mask is removed. If a non-refractory metal, such as Co or Ti is to be employed for the silicide, then thermal activation of the gate material layer dopant is preferably carried out at this point. Referring to FIG. 4E, a dielectric film 35, e.g., silicon dioxide or silicon nitride, is then deposited, patterned, and etched to form a "hard mask" that protects the gate material layer regions 37 that are undoped, i.e., the non-gate regions corresponding to the photoresist pattern regions 34 of FIG. 4C. The dielectric film 35 is preferably thick enough to inhibit the subsequent silicide process while thin enough to easily accommodate the subsequent gate level photolithography and etch.

Figure 4F:
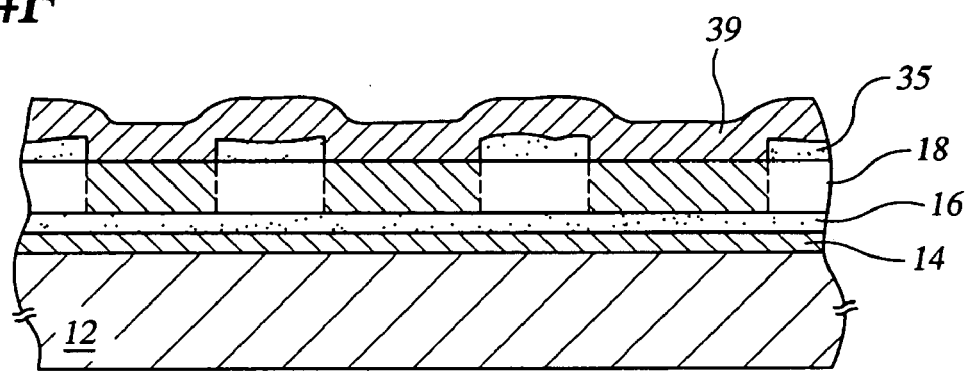

Referring to FIG. 4F, a selected metal layer 39 is then deposited and the substrate is annealed, following, e.g., one of the activation process steps described above, causing the metal and the amorphous silicon react to form the silicide. The unreacted metal regions that are not in contact with the gate electrode layer 18 are then selectively etched. Additional anneals may be applied to further reduce the silicided film resistivity. The thickness of deposited metal layer 39 is preferably optimized in concert with the gate material layer film thickness, the dopant implant conditions, and the anneal conditions to result in low sheet resistance and uniform doping.

Figure 4G:
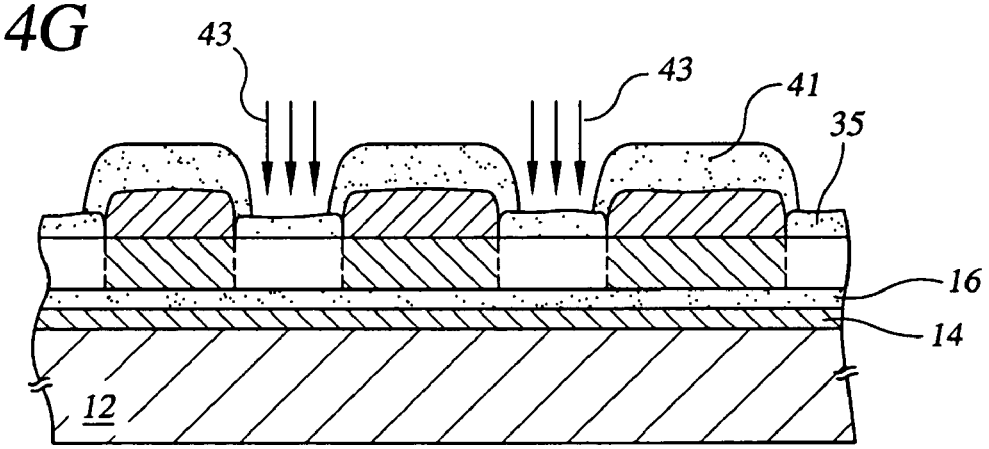

Referring to FIG. 4G, a new layer of photoresist 41 is then deposited and patterned such that the regions of the doped and silicided gate material layer that are to form the gates are covered in resist while the remainder of the layer is exposed. The dielectric hard mask and the undoped, unsilicided gate layer material are then etched, preferably using a gaseous plasma etch 43. Once the gate level etch is complete the patterned photoresist layer is removed. This results in a CCD structure like that of FIG. 1, with silicided gate electrodes.

This sequence of silicide formation followed by gate material layer etching, can be reversed. Specifically, the gate material layer can be first patterned and etched, followed by hard mask layer deposition and patterning to protect the interelectrode gap regions, then ion implantation, dopant activation, and silicide formation. In this etch-first scenario, the following cautions must be noted, however. The gate-level etch must not penetrate the gate dielectric and expose the substrate, for such exposure would create a silicide defect if there were a void in the hard mask. The ion implantation energy and thermal activation conditions preferably are selected to uniformly dope the thickness of the film, without penetration of the ions through the hard mask in the interelectrode gap regions, and without penetration of the gate insulator layer, should such be exposed, as explained previously.

With the gate level material dopant activated and the gates mechanically defined, the CCD gate structures are complete in accordance with the invention. Subsequent processing steps can then be carried out in the conventional manner to complete fabrication of the CCD devices. For example, deposition and patterning of dielectric and metal films can be carried out to produce electrical interconnects between devices, with dielectric layers providing isolation between the polysilicon and the metal lines, as well as isolation between multiple layers of metallization. Contact holes can be etched through these dielectric layers to interconnect the metal lines and the polysilicon features in the conventional manner.

Figure 5A:
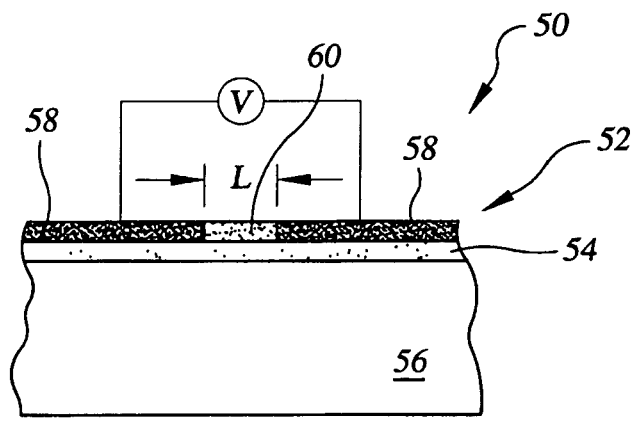
FIG. 5A is a schematic cross-sectional view of a test electrode configuration including an undoped section of extent L, experimentally employed for determining a preferable lithographic mask pattern in accordance with the invention.

As discussed above, it is preferable in accordance with the invention to design the process sequence with consideration for the extent to which a dopant introduced in the central region of a gate structure will diffuse to flanking end regions of the gate structure. Referring to FIG. 5A, to investigate this issue, a test pattern 50 was fabricated, consisting of polysilicon layers 52 overlying a dielectric layer 54 on a silicon substrate 56. The polysilicon layer was patterned into strips each having dopant-implanted regions 58 separated by a central, narrow non-implanted region 60 of extent L, as shown in FIG. 5A.

Measurements of the electrical conductivity were made on patterns with various values for non-implanted extent, L, and three dopants, namely, As, B, and P. After a high-temperature dopant activation step, the extent of the non-implanted region, L, diminishes due to dopant diffusion into that region, effecting the electrical conductivity measurements.

Figure 5B:
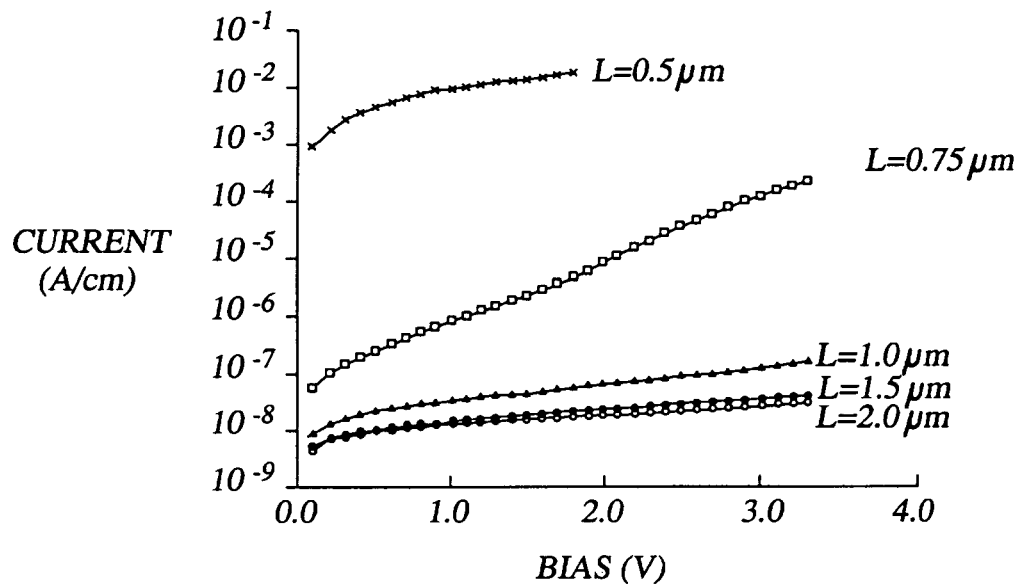
FIG. 5B is a plot of current as a function of voltage applied to the test electrode configuration of FIG. 5A for a range of various L values.

I–V curves were produced for the various structures by applying a voltage across the undoped region of each polysilicon strip; these curves are provided in the plot of FIG. 5B. The measured data for As show significant conductance for $L<1.0$ µm, while for $L>1.0$ µm there is a low residual conductance associated with the highly resistive undoped polysilicon. Results for boron were very similar, while for P the onset of higher conduction occurred at slightly smaller L. It is tempting to conclude from this data that the dopants diffused laterally almost 0.5 µm, and that for $L=1.0$ µm the arsenic-doped regions were just about to merge. However, the diffusion of dopants in polysilicon is more complicated than in single-crystal silicon. Dopant diffusion proceeds along grain boundaries more rapidly than through the grains themselves, so in fact the measured rise in conductance for $L<1$ µm may occur first along grain boundaries that cross the gap between implanted regions. In this picture the dopants are distributed in a non-uniform manner along the edge of the gate, with "fingers" of dopant extending out along grain boundaries, while the main distribution of impurities is somewhat closer to the original implant site.

Figure 6:
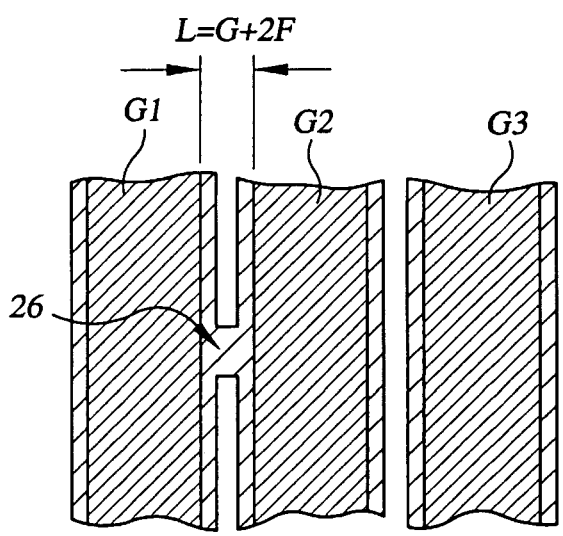
FIG. 6 is a planar view of three adjacent gate structures, like that of FIG. 3, here explicitly illustrating the definition of the value of L in a CCD structure.

Referring to FIG. 6, these experimental results give design guidelines for determining the two mask patterns employed for producing the CCD gate structure of the invention. The undoped region, L, of each test structure, corresponds to the interelectrode gap, G, and flanking end regions, F, of each gate electrode as shown in FIG. 1, i.e., $L=G+2F$. This extent, L, corresponds to the aperture (32 in FIG. 4C) for dopant introduction into the gate material layer.

FIG. 6 illustrates the three-gate structure of FIG. 2, here with the adjacent gate dopant separation parameter, L, explicitly shown. Based on the results above, it is understood that for arsenic and boron dopants, the gate dopant separation parameter L is preferably at least about 1.0 µm for the example process conditions described above. With this separation requirement, a mechanical bridge between two gates due to unetched gate material would be of undoped, high resistance material, in the manner described above, and therefore would not alter the voltages applied to the CCD gates to affect CCD device performance.

It is further instructive in accordance with the invention to evaluate simulation results for CCD device operation at various values of gate dopant separation distance L and various dopant distributions. Of particular interest for most applications are the effects on a CCD charge collection and transfer channel of the etched gap between adjacent single-level electrodes as well as the undoped end flanking regions of the gate electrodes.

Figure 7:
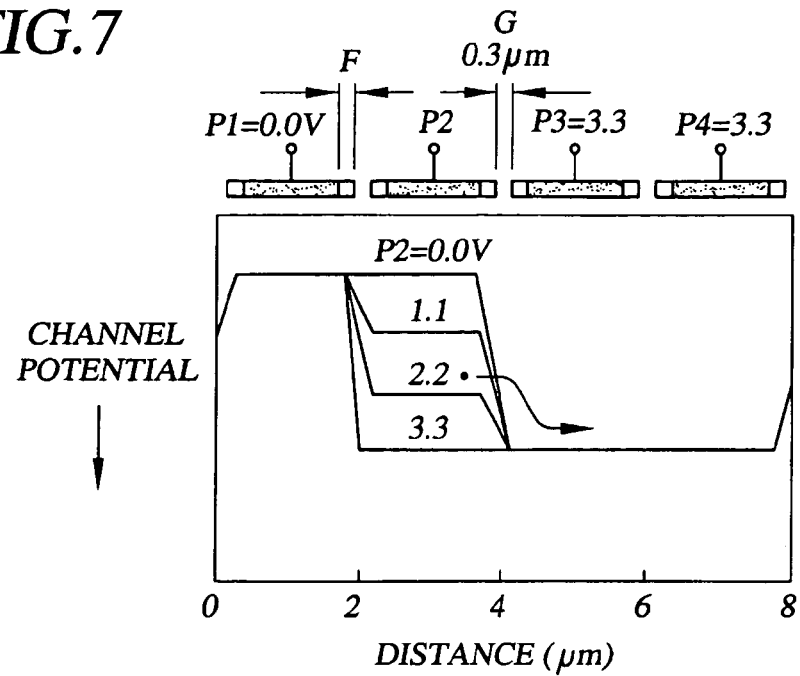
FIG. 7 is a plot of electrical potential of a CCD charge transfer channel as a function of distance along a CCD channel for four control gates as shown above the plot.

FIG. 7 provides a side-view illustration of an example CCD device structure for simulation. Here four gates of a four-phase CCD are included, with an 8-µm pitch. Also shown in the figure are the idealized channel potentials resulting from operation with 3.3 V clocking waveforms imposed as the potential on phase 2 is lowered to transfer charge from that phase to phases 3 and 4. Phase 1 is held low to maintain separation of the charge packet from the preceding and following stages. As shown in the figure, the gates are separated by etched gaps, G, of 0.3 µm, and each gate includes a central doped region with undoped end flanking regions of width F from the two gate edges.

One question concerns the undoped material bridge between two adjacent gates shown in FIGS. 2 and 6. Even though such a mechanical bridge will not be a fatal defect for a sufficiently large value of dopant separation distance, L, it is of interest to know how the electrical potential of the CCD channel is affected by this mechanical bridge, and whether good charge transfer can be expected even with the inclusion of such a bridge.

To answer this question operation of the structure of FIG. 7 was simulated, here with the gap between two adjacent gate electrodes filled with undoped polysilicon. This created a region of width L, given by 0.3 µm+2F, of undoped polysilicon between two adjacent doped regions. The results of this simulation are plotted in FIGS. 8A–8C. Here it is found that the undoped polysilicon bridging sections can produce electrical potential dips, or pockets in the channel potential. These pockets occur beneath the undoped polysilicon regions and can trap charge, with potentially deleterious effects on the CCD charge-transfer efficiency (CTE).

Figure 9:
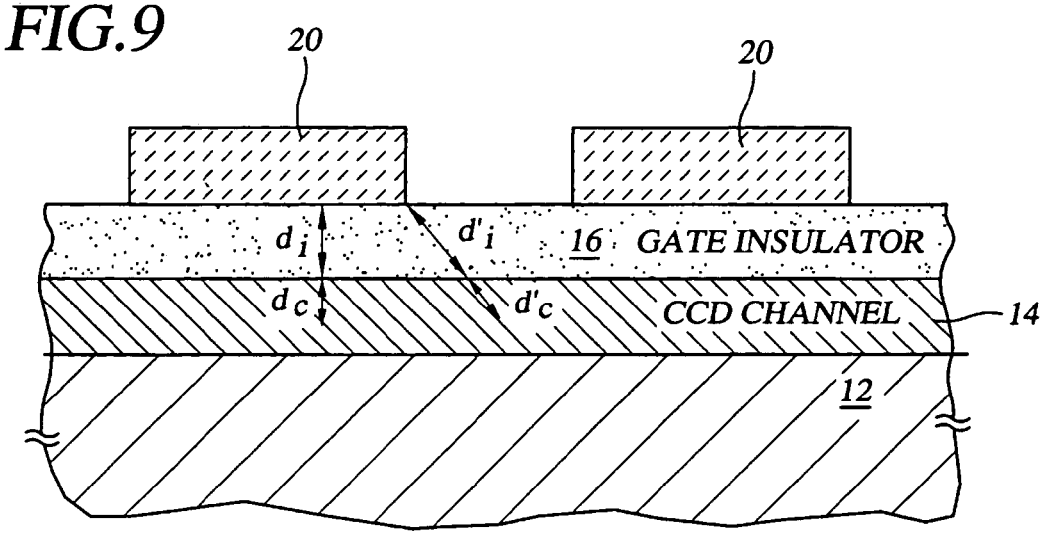
FIG. 9 is a schematic cross-sectional view of a configuration with a CCD gate structure atop a buried charge collection and transfer channel for simulating electrical potential of the charge collection channel.

The origin of the potential pockets can be understood from an electrostatic model based on the configuration shown in FIG. 9, wherein is shown in detail the gate dielectric layer 16 atop a silicon substrate 12 including a buried CCD charge collection and transfer channel 14. As given in the figure, $d_i$ is the thickness of the layer 16 of gate dielectric material and $d_c$ is the distance from the silicon surface at the interface with this dielectric material to the point of maximum potential in the buried channel 14 where the collected charge resides. The electrical potential difference from the CCD layer 14 channel to a CCD control gate 20 is the sum of $V_c$, the potential across the distance $d_c$, and $V_i$, the potential across the dielectric layer, where:

$$V_c = \frac{qN_D d_c^2}{2\varepsilon_s} \text{ and } V_i = \frac{qN_D d_c d_i}{\varepsilon_i}. \quad (1)$$

Here q is the electron charge, $N_D$ is the buried-channel doping level, and $\varepsilon_s$ and $\varepsilon_i$ are the dielectric permittivities of silicon and the gate insulator. In the center of the gap region the distances $d_i'$ and $d_c'$ from a control gate to the charge collection channel are larger, and thus the channel-to-gate voltage is higher here. Clearly, as the gap between two adjacent gate electrodes is narrowed the differences between $d_i$ and $d_i'$ and between $d_c$ and $d_c'$ are reduced, and the depth of the electrical potential pocket correspondingly diminishes.

With this model, insight can be had into how the various device parameters influence the electrical potential pocket depth, by computing the difference in the gate-channel potentials, $\Delta V$, beneath the gate and in the interelectrode gap, as:

$$\Delta V = V_c' + V_i' - (V_c + V_i) = \frac{qN_D G^2}{8\varepsilon_s} \cdot \frac{1 + \frac{2\varepsilon_s d_i}{\varepsilon_i d_c}}{\left(1 + \frac{d_i}{d_c}\right)^2} \quad (2)$$

where G is width of the gap as given above. Expression (2) above shows that the donor concentration, $N_D$, and the interelectrode gap, G, play a direct role in determining the electrical potential pocket depth, but the influence of $d_i$ and $d_c$ is less clear. For example, using the values for the fabricated CCD array described above, it was found that $\Delta V$ changes less than 14% with a 2× increase or decrease in $d_i$ or $d_c$. However, a change in $d_c$ also requires an adjustment in $N_D$ in order to maintain optimum well capacity, with $N_D$ increasing as $d_c$ decreases.

Figure 8A:
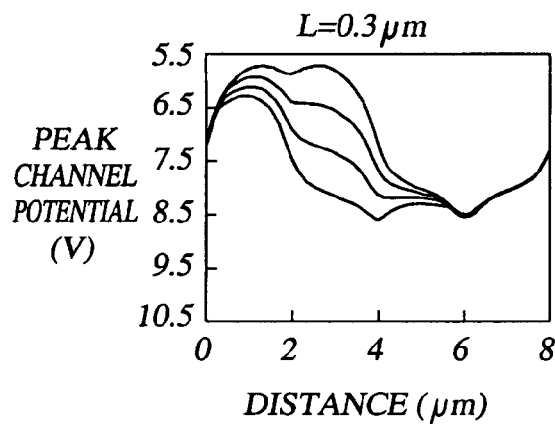
FIGS. 8A–8C are plots of peak channel potential as a function of distance for three values of L as given in FIG. 6.
Figure 8B:
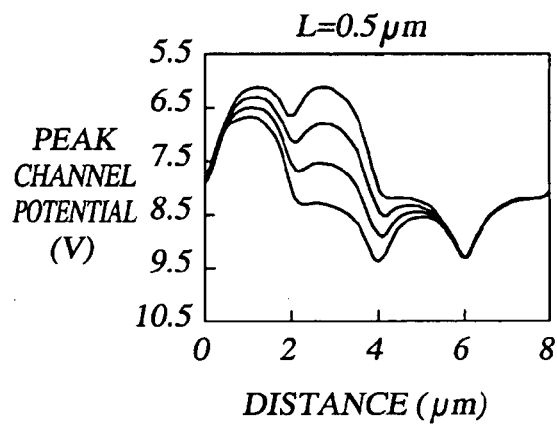
Figure 8C:
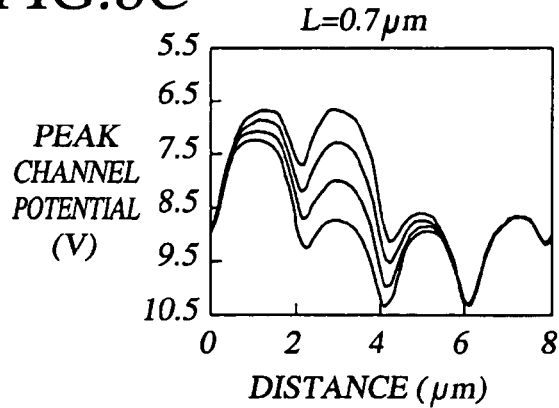

Turning back to the simulation results of FIGS. 8A–8C, the case of L of about 0.3 μm, an electron collected in the channel under the P2 gate, in the configuration of FIG. 7, encounters no electrical potential pocket in its path to the P3 gate once the potential of the P2 gate has dropped to 2.2 V. Only when the potential of the P2 gate is close to 0 does a problematical electrical potential pocket form, here between the P1 gate and the P2 gate, but at this point, almost all the electrical charge will have already been transferred.

The cases of L=0.5 and 0.7 μm are found to be more deleterious, in that an electrical potential pocket is found to be formed at the left edge of the P2 gate, where charge can be trapped at all voltages. Nevertheless, it can also be seen that the pocket depths are strongly influenced by the difference in gate potentials. As a result, raising of the control clock voltage amplitudes above 3.3 V is understood to be a technique for eliminating this problem. Thus, in accordance with the invention, it is understood that there is a tradeoff to be made between the allowable L values and the clock amplitudes required to sufficiently reduce electrical potential pockets to a level that enables sufficient charge transfer for a given application.

Turning now to simulation results relating to the impact on CCD channel potential by the etched gap distance, G, between adjacent electrodes, simulations were carried out in which it was assumed that implanted dopants diffused uniformly to all edges of each gate electrode. It is found that a device with G=0.3-μm etched gaps and L=0.6 μm performed well, both in simulations and experimentally.

Figure 10A:
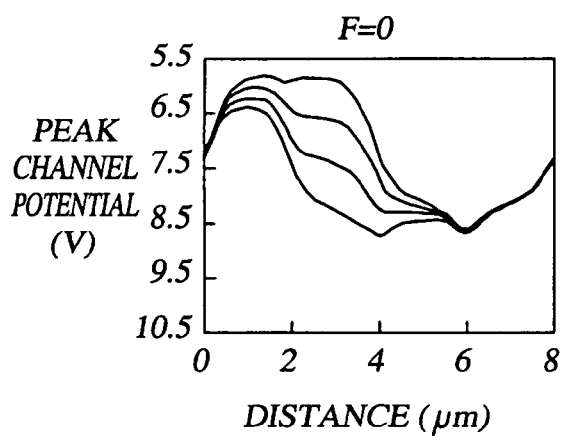
FIGS. 10A–10C are plots of peak channel potential as a function of CCD gate electrode flanking end regions, F, as defined in FIG. 1, for three values of F, as a function of distance, for the configuration of FIG. 9.
Figure 10B:
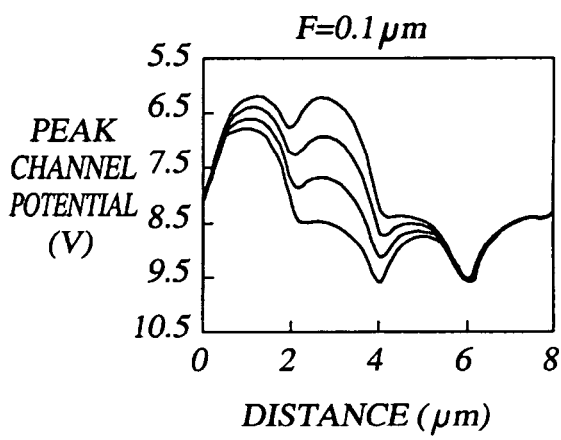
Figure 10C:
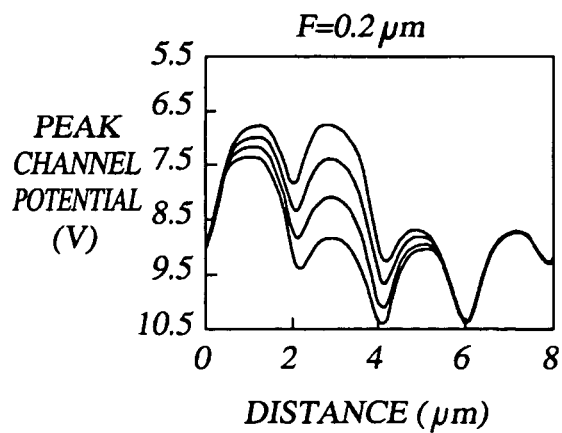

Further examined were simulation results for cases in which the gate material layer dopant does not reach the edge of the gate, thereby resulting in the undoped end flanking edge regions of extent F shown in FIG. 1. In FIGS. 10A–10C are given plots of a simulation with various values of flanking region extent, F.

The net distance, L, between doped regions of adjacent gates, i.e., 0.3 μm+2F, is the same in this case as the values in FIGS. 8A–8C, so a direct comparison can be made between the six plots. It is apparent that the CCD channel potentials are not significantly changed by the inclusion of undoped flanking regions at the edges of each CCD gate. In other words, a mechanical material bridge across an interelectrode 0.3-μm gap with undoped polysilicon flanking regions has virtually no impact on the channel potentials, and charge transfer in regions where the polysilicon gap was not etched should be the same as in regions with gaps.

The main conclusion from these simulations is that when the distance, L, between the doped regions of adjacent CCD control gates is less than about 0.3 μm, good charge-transfer efficiency can be expected. Accordingly, given a dopant separation distance L between adjacent gates of at least about 1.0 μm, it is understood that impurity diffusion is sufficient to leave a gap of less than about 0.3 μm of undoped silicon, resulting in good charge transfer efficiency.

EXAMPLE

This dopant separation distance specification was experimentally tested with experimental four-phase CCD imager designs including a 128×128 array of pixels. Each pixel in the array measured 8×8 μm and was fabricated following an n-type buried channel CCD process like the process described above, including deposition of an amorphous gate electrode material layer. A number of the test imagers were designed with a gate electrode separation distance, between adjacent gates, of about 0.3 μm. A number of the test imagers were also designed with no interelectrode separation; i.e., with continuity in the gate material layer. In both cases a gate electrode dopant implant mask was employed, defining 1.0 μm long doped gate electrodes separated by 1.0 μm undoped regions, i.e., with L, given above, set at 1.0 μm, as recommended by the analysis give above. A $BF_2$ implantation process was employed to dope the masked gate electrode layer. The implanted dopant was then activated employing a rapid thermal anneal process like that described above.

The test imager devices having no gate electrode separation, i.e., with no interelectrode gaps etched in the gate electrode layer, were devised to determine how the performance of a device would be impacted by an error in the gate electrode gap etch step. Specifically, the continuous gate material layer enabled testing to determine if those areas of an imager that is fabricated in accordance with the invention but includes regions at which interelectrode gaps fail to be etched, e.g., through processing defects, would not only be free of electrical shorts between adjacent gate electrodes but would also function satisfactorily in terms of charge transfer.

Both the continuous-gate-material imagers and the etched-interelectrode-gap imagers were operationally tested to measure charge-transfer efficiency. This test was carried out using as a stimulus the soft x rays from an Fe-55 radioisotope source, in the manner well-known for CCD imager testing. This radiation produces charge packets of approximately 1600 electrons. The tests were carried out employing a gate electrode control clock voltage of 4 V amplitude. The tests were carried out at reduced temperatures, of about −35 to −60 C, in order to reduce the background charge, due to dark current, that was found to be unusually high due in the test imagers due to relatively poor material quality. Even with this condition, the operational tests of the imagers indicated that the transfer efficiency per CCD stage was at least about 99.9%, that is, any charge loss was less than about 0.1%. This indicates that the CCD design in accordance with the invention, with L, the specified distance between adjacent doped gate electrode regions, being at least about 1.0 μm, provides the ability to produce operationally superior devices even when process and/or masking errors do not result in the precise device design.

Figure 11A:
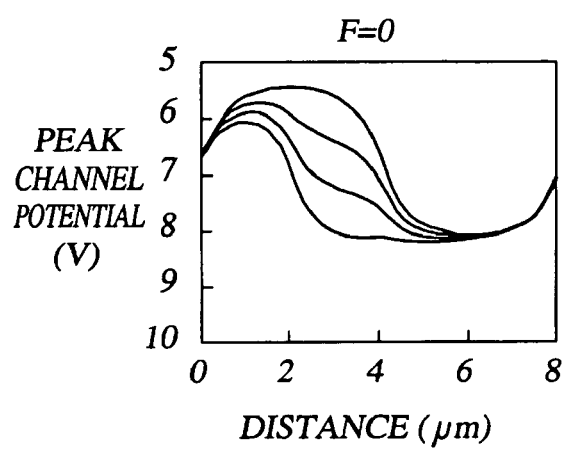
FIGS. 11A–C are plots of peak channel potential as a function of CCD gate electrode flanking end regions, F, as defined in FIG. 1, for three values of F, as a function of distance, for the configuration of FIG. 9.
Figure 11B:
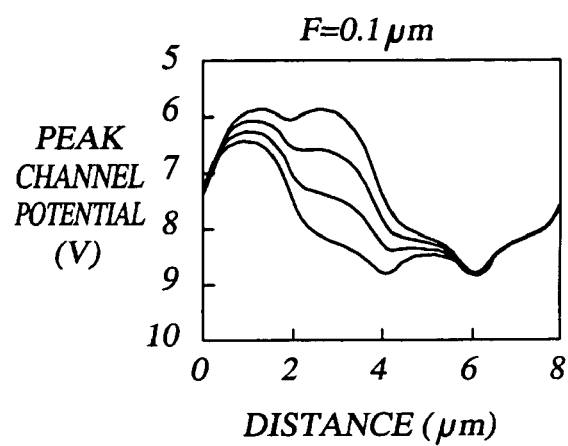
Figure 11C:
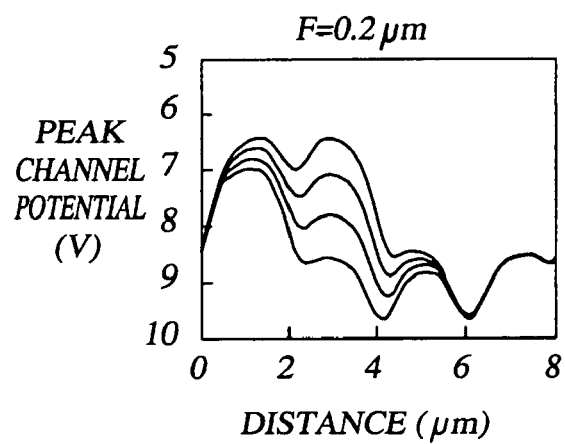

Turning to other device considerations, it is understood in accordance with the invention that fluctuation in the electrical potential of a CCD channel can be compensated for by counterdoping of the CCD channel in the gaps between adjacent gate electrodes. This counterdoping can be carried out by, e.g., an ion implantation step employing the gates themselves as a mask for automatic alignment registration with the gap. Simulations of the potential resulting from such a counterdoping technique are plotted in FIGS. 11A–11C. Here the simulation assumed counterdoping of implanted boron at a dose of $5 \times 10^{11}$ and at an energy of 40 keV. Comparing these results with those of FIGS. 10A–10C shows that the electrical potential pockets are eliminated for F=0, and reduced to a point where they would pose no problem for F=0.1 µm.

It is recognized that this counterdoping technique may not be preferable for all applications, however, and specifically would not be operable for situations in which a polysilicon bridge is known to exist between two adjacent gate electrodes. In such a situation, it can therefore be preferable to compensate for electrical potential pockets by raising clock voltage amplitudes.

In accordance with the invention, the single-level CCD gate fabrication processes described above can be applied to a wide range of devices and structures. The single-level CCD gate fabrication can be particularly advantageous for reducing the complexity of conventionally multi-level electrode devices. For example, an orthogonal-transfer CCD (OTCCD) is a four-phase CCD device that conventionally requires a rather complicated fabrication process, including four levels of polysilicon. Details of the OTCCD design and conventional four-level polysilicon fabrication sequence are given in U.S. Pat. No. 5,760,431, entitled "Multidirectional transfer Charge-Coupled Device," the entirety of which is hereby incorporated by reference.

The four-phase, four-level gate design conventionally employed for the OTCCD presents significant challenges for achieving a high yield in fabrication. It is found to be particularly difficult to fabricate an OTCCD structure with CCD pixel sizes less than about 10 µm. This presents a serious limitation for a range of important applications, and thereby restricts the applicability of the OTCCD.

Figure 12A:
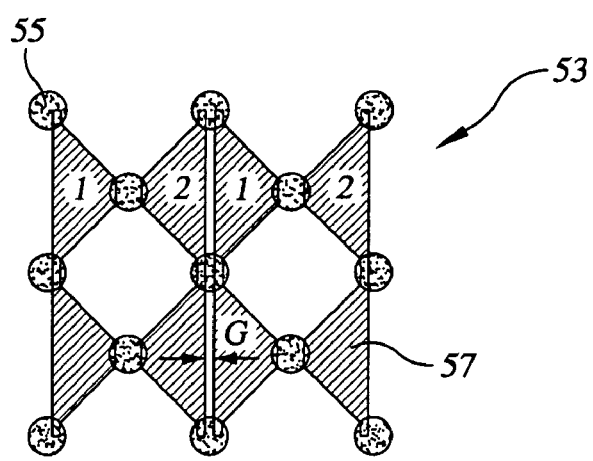
FIGS. 12A–12B are planar views of a four-phase, orthogonal transfer CCD (OTCCD) fabricated in accordance with the invention with two gate layers.

In accordance with the invention, the four gate levels conventionally employed in the OTCCD design can be reduced to two gate levels. Referring to FIG. 12A, there is shown a 2×2 array of pixels 53, after channel stops 55 have been defined and a first gate layer 57 of polysilicon has been deposited, doped, and patterned in accordance with the fabrication process sequence given above. This first gate layer provides gate electrodes for phases 1 and 2 of the four-phase CCD transfer sequence; the corresponding electrodes are thusly labeled in the figure. These electrodes are separated by a narrow gap, G, corresponding to the inter-electrode gap, G, of the CCD structure of FIG. 1.

Figure 12B:
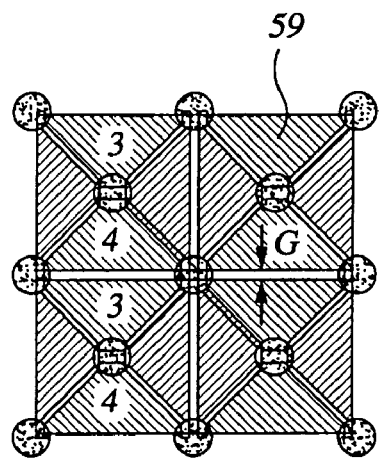

Once this first two-phase gate layer is complete, the layer is oxidized to provide an insulting layer over its surface, and a second gate layer is deposited, doped, and etched in accordance with the fabrication sequence of the invention described above, to produce a second gate layer 59, as shown in FIG. 12B. The electrodes of this layer provide control gates for phase 3 and 4 of the four-phase CCD transfer sequence, as labeled in the figure. As with the first gate layer, the gates of the second gate layer are separated by an inter-electrode gap, G.

The fabrication sequence of the invention enables production of this two-level, four-phase gating structure, having narrow inter-electrode gaps, with high yield, while reducing the number of fabrication steps and the overall fabrication complexity. Note that because the first gate material layer must undergo an oxidation step, the dopant activation for that layer is preferably carried out during the oxidation. For example, a 20 minute-long, 900° C. steam oxidation can be employed to produce the dielectric layer and to activate the first gate material dopant. Note that process simulation like that described above is found to show that the minimum value of L that is preferably employed for the masks of the two gate layers is increased by about 0.5 µm to account for this step.

Figure 12C:
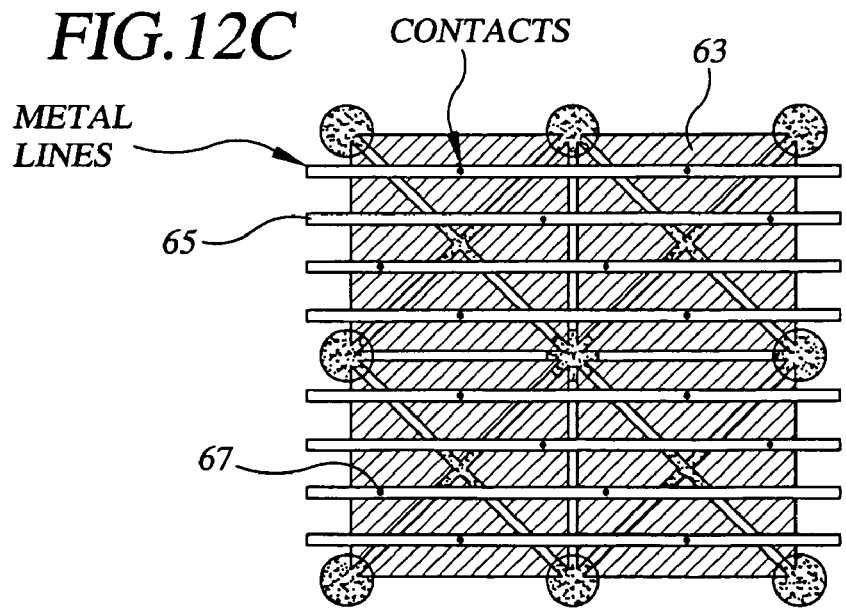
FIG. 12C is a planar view of a four-phase, orthogonal transfer CCD (OTCCD) fabricated in accordance with the invention with one gate layer.

Referring to FIG. 12C, the four gate phases of the OTCCD can be produced in a single level of gate layer material. Here the triangular gates 63 must be interconnected with metal lines 65. This can be accomplished with contact holes 67 that are etched through an insulating layer covering the gate material layer. This design demonstrates the wide applicability of the structure and fabrication sequence provided by the invention, particularly for reducing complexity and increasing yield of complicated devices.

The invention is not limited to conventional CCD designs, and in fact can be applied to any device design in which separated control electrodes are required. For example, control gates for ionic liquid separation and analysis, like that described by S. A. Gajar and M. W. Geis, in "An ionic liquid-channel field-effect transistor," *J. Electrochem. Soc.*, V. 139, N. 10, PP. 2833–2840, October, 1992, hereby incorporated by reference, can be produced based on the gate design and fabrication of the invention.

Turning to further alternative configurations, the invention is not limited to CCD structures employing an explicitly separate gate level material. For example, the invention is applicable CCD structures such as junction CCD (JCCD) structures, in which CCD gates are formed in the bulk of a silicon substrate itself.

Figure 13A:
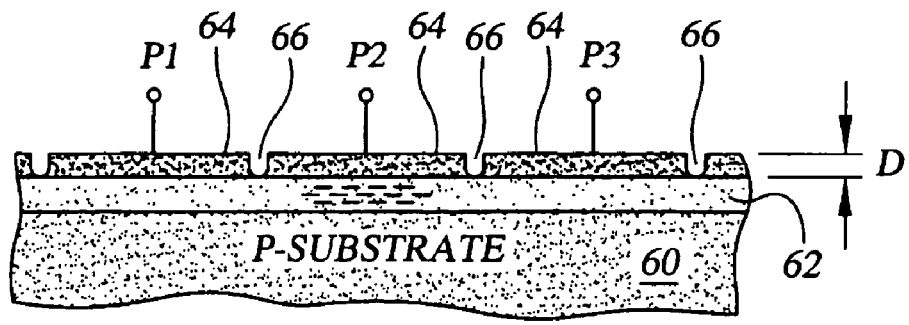
FIG. 13A is a schematic cross-sectional view of a junction CCD (JCCD) structure fabricated in accordance with the invention.

In one example of such a structure, shown in FIG. 13A, a p-silicon substrate 60 is provided, the surface of which is doped n-type to form an n-buried channel 62. Charge control gates 64 of the CCD structures are formed of p+ regions of the substrate formed by, e.g., dopant implantation and diffusion into the n-type surface region. Narrow notches 66 are etched into the silicon surface to a depth just below the p+ gate region depth, D, to electrically isolate adjacent gates. Conventional fabrication techniques for producing this JCCD structure are quite vulnerable to lithographic defects that can lead to bridging shorts between adjacent gate structures.

Figure 13B:
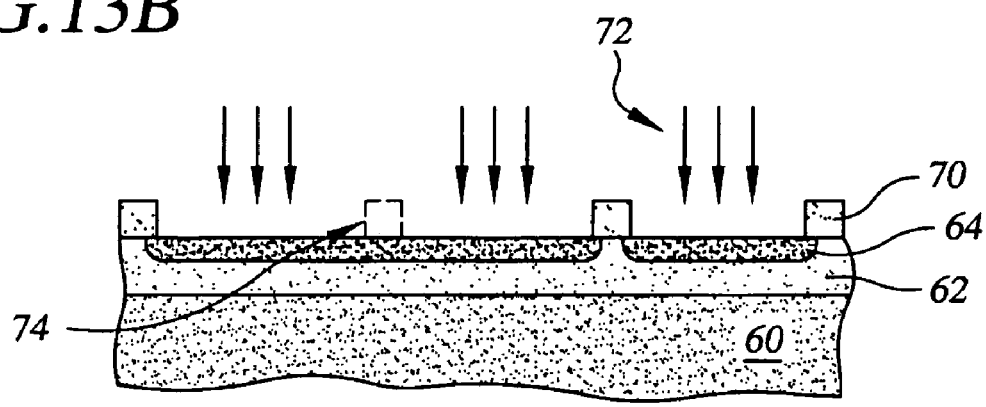
FIGS. 13B–C are schematic cross-sectional views of fabrication process steps in accordance with the invention for the production of the JCCD structure of FIG. 13A.
Figure 13C:
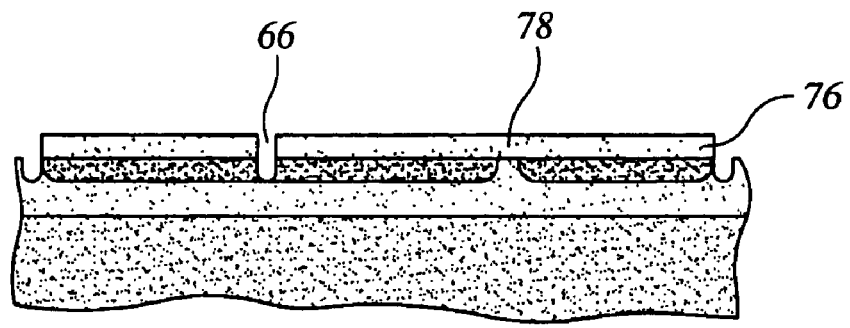

In accordance with the invention, such JCCD bridging shorts can be significantly reduced or eliminated by the two-step gate formation process of the invention. Referring to FIGS. 13B–C, in a first step of the process, a photoresist layer is patterned to function as a dopant implant mask for producing a p+ gate dopant implant to define the gates. A dopant implant 72 is employed in conjunction with the mask to produce gates defined by distinct and separated doped regions corresponding to the dopant mask, unlike the continuous dopant implant resulting in the configuration of FIG. 13A.

After the dopant implant, in the example shown in FIG. 13B, a defect in the photoresist layer has resulted in a missing photoresist mask region 74, producing a continuation of gate dopant between what was intended to be two separated gate regions. But because a second photolithographic step is required by the invention to fully define the gate structures, this dopant continuation is not sufficient to produce a fatal bridging connection between gate structures.

Referring to FIG. 13C, in the second step of the process of the invention, narrow slots 66 are etched through the implanted gate dopant region, employing a second patterned masking layer. As shown in FIG. 13C, this slot etch results in a mechanical separation of the location where the gate implant inadvertently extended continuously between two adjacent gate locations as shown in FIG. 13B. As a result, the lithographic error in the first process step has been automatically remedied.

Also shown in FIG. 13C is an example scenario in which an error in photolithography resulted in a location 78 at which no slot has been etched between two adjacent gate regions. But as shown in the figure, with the first lithographically-defined step of gate doping, the failure of the second step to produce mechanical isolation between adjacent gate regions does not result in a fatal conducting short; the two gate regions are electrically isolated. Such a fatal conducting short could only be produced if the lithographic error from the first step corresponded to the precise location at which the lithographic error from the second step occurred. Such is very unlikely, and accordingly, a high process yield is enabled by the invention for the JCCD structure.

This process example illustrates the breadth of CCD-like device configurations to which the two-step single-gate-level microfabrication process of the invention can be applied. No specific materials or particular device configurations are required; all that is required are two independent lithographic steps for together defining CCD gate structures in a single level of gate material. The invention is therefore not to be limited to the example processes and example fabrication techniques described above.

Compared with conventional two-level and three-level overlapping-gate CCD microfabrication processes, the single-gate-level microfabrication process of the invention is much less complicated, as well as less costly and time consuming. From CCD device considerations, the single-gate-level microfabrication process of the invention subjects device structures and substrates to a lower thermal processing budget than conventional multi-gate microfabrication sequences. Further, the elimination of overlap of multiple gates by the single gate level process of the invention reduces gate capacitance and therefore enables minimization of the CCD clock drive power. In addition, the microfabrication sequence of the invention enables the use of silicidation to reduce the typically long RC time constants that commonly are a disadvantage of large CCD arrays.

A single-gate-level CCD array produced in accordance with the invention finds a wide range of important applications. In general, the manufacturing simplicity of the configuration lends it to any CCD array structure application. But for critical applications requiring relatively large-area CCD arrays, the single-gate-level structure and fabrication process of the invention can be particularly advantageous. Specifically, the characteristically high process yield enabled by the invention results in the ability to fabricate large-area CCD arrays with a level of operational functionality that is sufficiently high to satisfy the requirements of many critical imaging applications. For example, medical applications such as digital radiography techniques, e.g., in which a low X-ray dose is desired, require a large-area imager to collect sufficient incident radiation, and require that the full imager area be functional. Other medical applications, and a wide range of technical applications, such as advanced scanning electron microscopy techniques, also optimally employ large-area imagers that are substantially entirely functional. The invention addresses these applications with an elegantly simple manufacturing process that results in high device yield.

It is further to be recognized that the gate fabrication techniques provided by the invention can be applied to a wide range of structures requiring adjacent location of conducting electrodes. MEMs and other systems requiring, e.g., precision interdigitated electrodes for control, sensing, or actuation, are well-addressed by the precision, high-yield fabrication sequence of the invention.

From the foregoing, it is apparent that the CCD gate design and fabrication sequence of the invention provides an elegant approach for enabling very tight tolerance control gate design while at the same providing the ability to achieve very high microfabrication yield. The design is flexible enough to accommodate a range of device and structure designs while preserving its ability to reduce fabrication complexity. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method of making a charge-coupled device comprising:
   forming an electrically conducting charge transfer channel in a semiconductor substrate;
   forming an electrically insulating layer on a surface of the substrate;
   forming a layer of gate electrode material on the insulating layer;
   forming on the gate material layer a first patterned masking layer having apertures that expose regions of the underlying gate material layer that are to form gate electrodes;
   electrically doping the first-pattern-exposed regions of the gate material layer;
   forming on the gate material layer a second patterned masking layer having apertures that expose regions of the underlying gate material layer that are to form gaps between gate electrodes; and
   etching the second-pattern-exposed regions of the gate material layer.

2. The method of claim 1 further comprising removal of the first patterned masking layer after electrically doping first-pattern-exposed regions of the gate material layer.

3. The method of claim 1 further comprising removal of the second patterned masking layer after etching second-pattern-exposed regions of the gate material layer.

4. The method of claim 1 wherein the first-pattern-exposed regions of the gate material layer are electrically doped before the second-pattern-exposed regions of the gate material layer are etched.

5. The method of claim 1 wherein electrically doping first-pattern-exposed regions of the gate material layer comprises ion implantation of a selected electrical dopant into the first-pattern-exposed regions of the gate material layer.

6. The method of claim 1 wherein etching the second-pattern-exposed regions of the gate material layer comprises plasma etching the second-pattern-exposed regions of the gate material layer.

7. The method of claim 1 further comprising heat treating the electrically-doped and etched gate electrode material layer to diffuse the electrical dopant through the gate material layer thickness.

8. The method of claim 7 wherein heat treating the electrically-doped and etched gate electrode material layer comprises annealing the gate material layer.

9. The method of claim 7 wherein heat treating the electrically-doped and etched gate electrode material layer comprises oxidation of the gate material layer.

10. The method of claim 7 wherein forming a first patterned masking layer and forming a second patterned masking layer each comprise forming a masking layer having a pattern the apertures of which are characterized by an extent accounting for lateral dopant diffusion during the heat treatment.

11. The method of claim 1 wherein forming an electrically conducting charge transfer channel in a semiconductor substrate comprises ion implantation of a selected electrical dopant into a silicon substrate, the selected electrical dopant being of a conductivity type opposite that of the silicon substrate.

12. The method of claim 1 wherein forming an electrically insulating layer on a surface of the substrate comprises forming a layer of oxide on the substrate surface.

13. The method of claim 1 wherein forming a layer of gate electrode material on the insulating layer comprises depositing a layer of amorphous silicon on the insulating layer.

14. The method of claim 1 wherein forming a layer of gate electrode material on the insulating layer comprises depositing a layer of polysilicon on the insulating layer.

15. The method of claim 1 wherein forming a first patterned masking layer and forming a second patterned masking layer each comprise forming a layer of photoresist that is photolithographically patterned.

16. The method of claim 1 further comprising:
forming a third patterned masking layer on the gate material layer, the third patterned masking layer having apertures that expose regions of the gate material layer;
depositing a metal layer that contacts the third-pattern-exposed regions of the gate material layer; and
siliciding the gate material layer by heat treating the metal and gate material layers.

17. The method of claim 1 further comprising:
forming an electrically insulating electrode separation layer on the electrically doped and etched gate electrode material layer;
forming an upper gate electrode material layer on the insulating electrode separation layer;
forming on the upper gate material layer a third patterned masking layer having apertures that expose regions of the underlying upper gate material layer that are to form gate electrodes;
electrically doping the third-pattern-exposed regions of the upper gate material layer;
forming on the upper gate material layer a fourth patterned masking layer having apertures that expose regions of the underlying upper gate material layer that are to form gaps between gate electrodes; and
etching the fourth-pattern-exposed regions of the upper gate material layer.

18. A method of making a charge-coupled device comprising:
forming an electrically conducting charge transfer channel in a semiconductor substrate;
forming on a substrate surface a first patterned masking layer having apertures that expose regions of the underlying substrate surface that are to form gate electrodes;
electrically doping the first-pattern-exposed regions of the substrate surface;
forming on the substrate surface a second patterned masking layer having apertures that expose regions of the underlying substrate surface layer that are to form gaps between gate electrodes; and
etching the second-pattern-exposed regions of the substrate surface.

19. A method of making electrically conducting electrodes comprising:
forming an electrically insulating layer on a surface of a substrate;
forming a layer of electrode material on the insulating layer;
forming on the electrode material layer a first patterned masking layer having apertures that expose regions of the underlying electrode material layer that are to form electrodes;
electrically doping the first-patterned-exposed regions of the electrode material layer;
forming on the electrode material layer a second patterned masking layer having apertures that expose regions of the underlying electrode material layer that are to form gaps between electrodes; and
etching the second-patterned-exposed regions of the electrode material layer.

20. A method of making electrically conducting electrodes comprising:
forming on a substrate surface a first patterned masking layer having apertures that expose regions of the underlying substrate surface that are to form electrodes;
electrically doping the first-pattern-exposed regions of the substrate surface;
forming on the substrate surface a second patterned masking layer having apertures that expose regions of the underlying substrate surface layer that are to form gaps between electrodes; and
etching the second-pattern-exposed regions of the substrate surface.

* * * * *

UNITED STATES PATENT AND TRADEMARK OFFICE
CERTIFICATE OF CORRECTION

| | | |
|---|---|---|
| PATENT NO. | : 7,217,601 B1 | Page 1 of 1 |
| APPLICATION NO. | : 10/691080 | |
| DATED | : May 15, 2007 | |
| INVENTOR(S) | : Barry E. Burke | |

It is certified that error appears in the above-identified patent and that said Letters Patent is hereby corrected as shown below:

Please delete the paragraph titled 'STATEMENT REGARDING FEDERALLY SPONSORED RESEARCH' encompassing column 1, lines 12-15:

"This invention was made with Government support under Contract No. F19628-00-C-0002, awarded by the Department of Air Force. The Government has certain rights in the invention."

and replace with:

--This invention was made with government support under Contract No. F19628-95-C-0002 awarded by the U.S. Air Force. The government has certain rights in this invention.--

Signed and Sealed this

Twenty-seventh Day of November, 2012

David J. Kappos
*Director of the United States Patent and Trademark Office*